United States Patent [19]

Kirk et al.

[11] 4,454,540
[45] Jun. 12, 1984

[54] AUTOMATIC LEVEL CONTROL CIRCUIT

[75] Inventors: Kenneth H. Kirk, Harleysville; George A. Fedde, Perkiomenville; Juan M. Gottschalk, Elkins Park, all of Pa.

[73] Assignee: Sperry Corporation, New York, N.Y.

[21] Appl. No.: 342,981

[22] Filed: Jan. 26, 1982

[51] Int. Cl.³ .............................................. H04N 7/18
[52] U.S. Cl. ................................ 358/106; 250/363 S; 356/448; 358/282; 358/293
[58] Field of Search ............... 358/101, 106, 107, 160, 358/168, 169, 280, 282, 284, 293; 250/337, 361, 363 R, 363 S, 368, 369, 458, 462, 483, 484; 356/448

[56] References Cited

U.S. PATENT DOCUMENTS 4,152,723 5/1979 McMahon ........................... 358/106
4,318,129 3/1982 Zwirn ................................... 358/169
4,399,469 8/1983 Lew ..................................... 358/282

Primary Examiner—Howard W. Britton
Attorney, Agent, or Firm—Marshall M. Truex; James R. Bell

[57] ABSTRACT

A scanning apparatus which periodically sweeps a beam of light across a printed circuit board along a plurality of sweep paths, includes a detector responsive to radiation from the printed circuit board as the board is swept by the beam of light. The detector is also responsive to first and second adjustment signals indicating whether a conductor portion or substrate portion of the board is being swept. An automatic level control is responsive to the first and second signals for providing level adjusted output signals via an adjustor coupled to the detector. The levels of the output signals form a ratio R substantially the same for all boards swept in the scanning apparatus.

17 Claims, 12 Drawing Figures

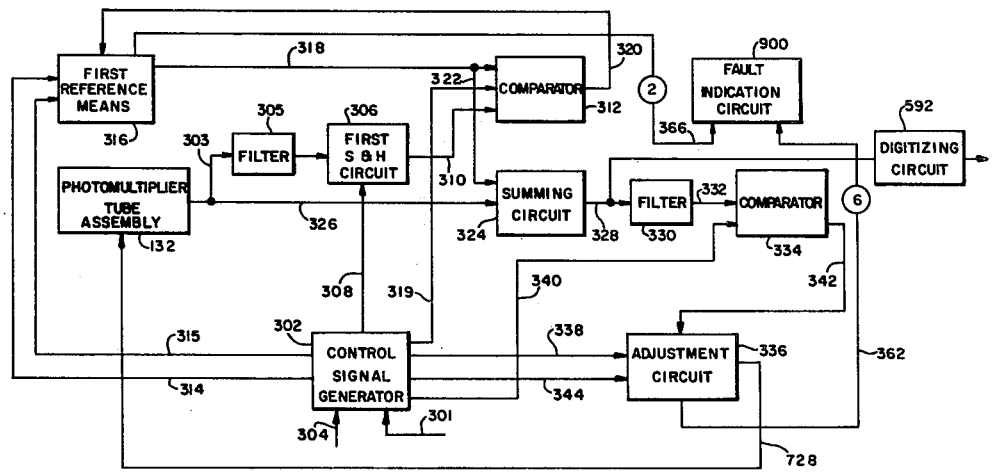

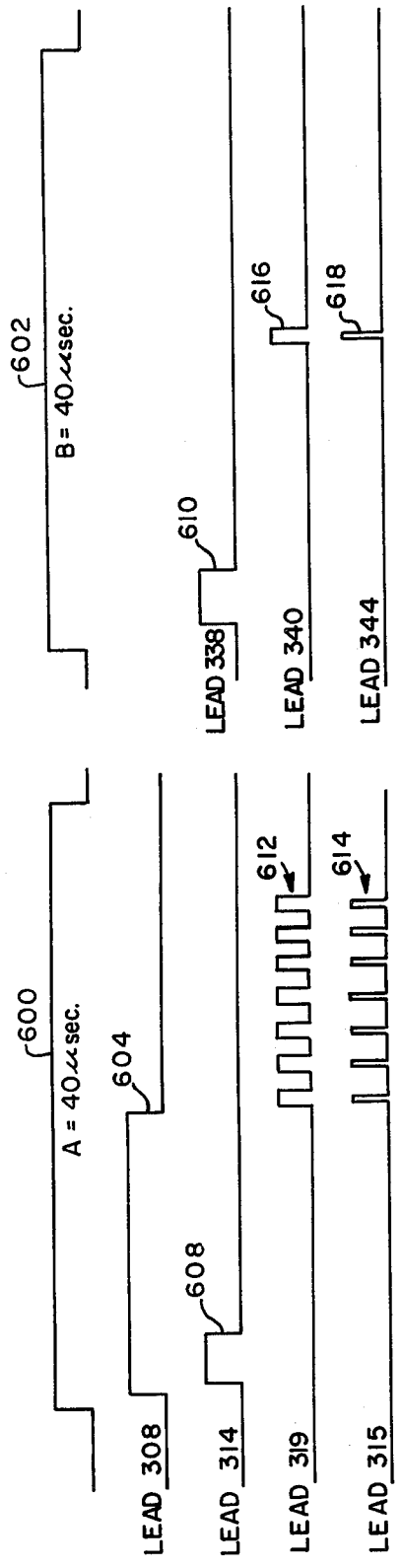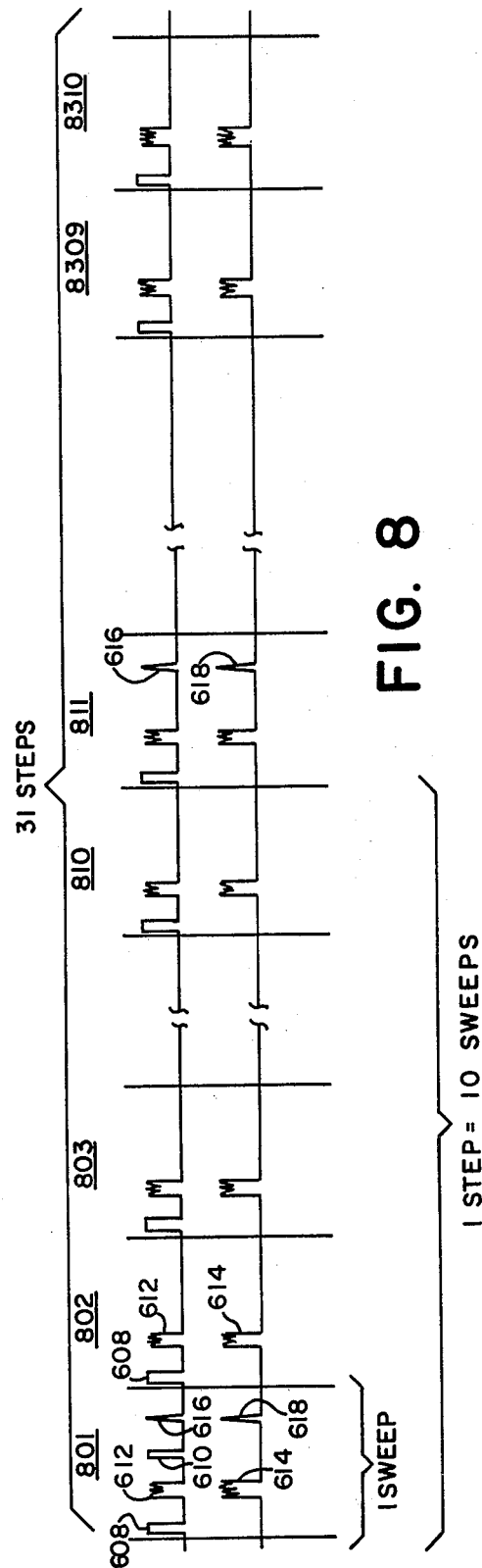

AUTOMATIC LEVEL CONTROL CIRCUIT

This application is related to the copending application of Juan M. Gottschalk et al., Ser. No. 342,980, entitled Automatic Level Control Circuit, and filed concurrently herewith.

BACKGROUND OF THE INVENTION

This invention relates to a circuit for automatically controlling the signal level of first and second signals, particularly, first and second signals representative of a binary image of a target surface where the image is generated by a light beam scanning apparatus.

Equipment exists for automatic inspection of printed circuit boards which boards comprise a pattern of metallic conductors on a non-conducting or insulating substrate. In such equipment, a scanning light beam, such as a laser beam, periodically sweeps across the surface of the printed circuit board, and a detector assembly portion of the equipment detects the response of various portions of the surface to the impinging laser beam. For example, in U.S. Pat. No. 4,152,723, which is hereby incorporated by reference as if specifically set forth herein, when a scanning laser beam impinges on the substrate, it excites "a detectable fluorescence in the surface of the insulating substrate" which is "detected by means sensitive to the wavelength of the fluorescence." The detector means will generate first and second signals depending on the absence or presence of fluorescence in the yellow-red wavelength range which first and second signals represent the presence of conductor or substrate. When the first and second signals are digitized and sychronized with the scanning of the laser beam, a binary image of the pattern of the conductors on the substrate is provided. In order to form an accurate binary image, signals from the detector portion representing conductor (for example first signals) and signals from the detector portion representing substrate (for example second signals) must be distinguished from one another and identified as first or second signals for each printed circuit board inspected by the apparatus. However, different printed circuit boards having different conductor and substrate characteristics generate varying signal levels for the first and second signals from one printed circuit board to the next. For example, the signal levels due to fluorescence of the substrate in one printed circuit board may be quite a bit different from the signal levels due to fluorescence in the substrate in another printed circuit board from a different manufacturer. Also, the reflected light characteristics from the conductors on a first printed circuit board and their effect on the detector output may differ from the reflected light characteristics from the conductors on a second printed circuit board. Therefore, it is necessary to provide a method and apparatus for automatically controlling over a wide range the level of first and second signals received from the detector portion to insure that signals representing conductor and signals representing substrate will be identified and digitized as such to provide an accurate binary signal image of the printed circuit board.

SUMMARY OF THE INVENTION

A detector assembly portion of a scanning apparatus generates signals having first and second signal levels in response to a light beam which periodically sweeps a pattern of metallic conductors on an insulating substrate of a printed circuit board. The signals are associated with the interaction of the light beam with either the metallic conductors or the substrate. In the preferred embodiment, where the scanning apparatus with which the detector is associated is of the type described in U.S. Pat. No. 4,152,723, the signals with first signal levels are associated with the conductors (conductor signals). They have a lower signal level than signals with second signal levels associated with the substrate (substrate signals).

The present invention relates to a method and apparatus for automatically producing adjusted output signals associated with the first and second signals and having values adjusted to predetermined signal values for all printed circuit boards inspected.

An object of the present invention is to provide a method and apparatus capable of producing a first reference signal having an absolute signal level substantially equal to the absolute level of the first signals generated by the detector assembly, combining the first reference signal with the first and second signals from the detector assembly to produce summed first and second signals, and changing the level of the second signals produced by the detector assembly whereby the summed second signals achieve a predetermined signal level.

A further object of the present invention is to provide an automatic level control circuit as described above including means for generating a first reference signal and means for providing a sample signal having a signal level representative of the signal level of first signals produced by the detector assembly during a first time interval when only first signals are produced by the detector assembly, the automatic level control circuit further capable of comparing the signal levels of first reference signal and the sample signal and changing the level of the first reference signal to equal the sample signal level.

An object of the present invention is to provide an automatic level control circuit as described above including means for generating a first reference signal having a level substantially equal to the level of the first signals produced by the detector assembly, and means for summing the first reference signal with the first and second signals to produce summed first and second signals, the automatic level control circuit further capable of comparing the level of the summed second signals with a predetermined signal level and causing the detector means to change the level of the second signals in response to the comparison.

Another object of the present invention is to provide an automatic level control circuit as described above capable of indicating when the level of the first signals generated by the detector assembly are above a predetermined maximum and when the second signals are above a predetermined maximum or below a predetermined minimum.

Another object of the present invention is to provide a method of automatically producing adjusted output signals associated with the first and second signals as described above, the method including forming first and second signal calibration strips on a printed circuit board being scanned whereby only first signals are generated during the first time interval and second signals during the second time interval.

Other objects, features and advantages of the present invention will become more fully apparent from the following detailed description of the preferred embodiment, the appended claims and the accompanying drawings in which:

BRIEF DESCRIPTION OF THE DRAWINGS

FIG. 6A illustrates various timing signals used in the operation of the present invention during a first adjustment interval;

FIG. 6B illustrates various timing signals used in the operation of the present invention during a second adjustment interval;

FIG. 8 shows when the timing signals of FIGS. 6A and 6B occur during operation of the present invention within an entire adjustment interval;

DETAILED DESCRIPTION OF THE INVENTION

Figure 1:
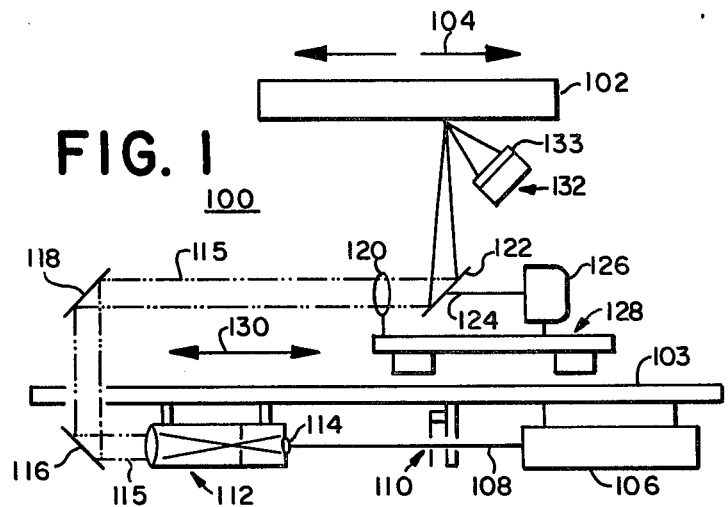
FIG. 1 is a schematic illustration of a scanning apparatus suitable for use with the present invention.
Figure 2:
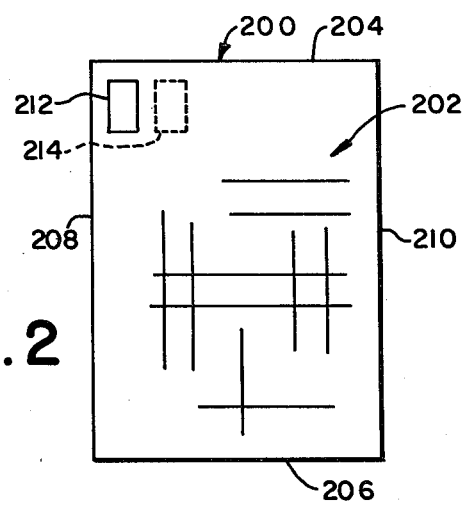
FIG. 2 illustrates a test specimen suitable for use with the scanning apparatus of FIG. 1.

FIG. 1 schematically illustrates an optical scanning system designated generally 100 suitable for use with the present invention. A portion of a printed circuit board (FIG. 2) hereinafter referred to as a PCB comprises a pattern of metallic conductors designated generally 202. The PCB is mounted in a precision PCB holder 102 (FIG. 1). The holder 102 is a portion of a cylinder forming a partial, right circular cylindrical inner surface. The printed circuit board is held on this inner surface. The holder 102 is mounted above a planar main support table 103 of the apparatus with the axis of the cylinder lying parallel to the line and arrows 104 and the plane of the table 103. When mounted in the holder 102 the surface and parallel edges 204 and 206 of PCB 200 are curved to conform to the cylindrical inner surface of holder 102. Parallel edges 208 and 210 extend in a direction parallel to line 104. It should be noted that the cylindrically shaped holder represents a preferred embodiment geometrical shape but other shapes could be employed in a scanning system used with the present invention. For example, PCB 200 could be mounted on a flat surface.

The scanning apparatus further comprises a laser beam light source 106 attached to the underside of table 103 which light source transmits a beam 108 to a safety shutter structure designated generally 110 also mounted to the underside of table 103. The shutter structure blocks the beam if a safety interlock (not shown) in the system is activated. Originally the beam has a $1/e^2$ diameter of 1 millimeter, where $e = 2.71828$.

After passing through the shutter structure 110, the beam enters a beam expander designated generally 112 (attached to the underside of the table 103) where it is spatially filtered through a 10 micron aperture 114 and has its diameter increased to 32 millimeters. The expanded beam is designated 115. Two 75 millimeter diameter, one tenth wavelength front surface mirrors 116 and 118 are used in a periscope arrangement to feed the beam 115 from below the table to above the table where it follows a path along the axis of a spot imaging lense 120. After passing through the lense 120 the beam 115 impinges on scanning mirror 122.

The scanning mirror 122 is mounted at a 45° angle on the center line axis of the laser beam 115. It is attached to a shaft 124 of an angular encoder 126 and is rotated thereby. The encoder with shaft and scanning mirror are mounted to a Y-axis translate table 128 which table is disposed to move along the direction of line and arrows 130, parallel to line and arrows 104. The beam 115 is reflected from mirror 122 and is focused to a small light beam on the surface of the printed circuit board 200 on the inner surface of holder 102. In the preferred embodiment, the $1/e2$ cross section of the beam as it impinges on the PCB has a diameter of 0.001 inches.

As the mirror 122 rotates it causes the laser beam to sweep across the PCB from one parallel edge to the other (for example, from edge 208 to edge 210). At the same time, the Y-axis translate table 128 is caused to move along the direction of line and arrows 130 at a slow rate. In the preferred embodiment, the Y-axis table 128 advances one thousandth of an inch per scanning mirror revolution.

In the preferred embodiment, the light source is a helium-cadmium laser which generates a blue light. When the blue laser light (0.001 inch diameter with 10 milliwatts of power) impinges on the substrate of the PCB in the holder, the substrate fluoresces producing light in the yellow-red wave length. When the beam falls upon a conductor, blue light is emitted therefrom but yellow-red light is not present.

The fluorescent yellow-red signal from the scanning spot is detected by a photomultiplier tube assembly designated generally 132 in FIG. 1 and mounted on Y-axis table 128 for movement therewith. In the preferred embodiment illustrated in FIG. 7, there are four photomultiplier (PMT) tubes 702, 704, 706 and 708 (EMI Gencom Incorporated, Number 9871RA Extented S5, 30 millimeter side window devices). The PMT's are arrayed in an arc, and positioned off the perpendicular to the axis of the cylindrical holder 102 as shown in FIG. 1 in order to avoid direct specular reflection from the PCB. Each PMT is equipped with a filter (133) designed to pass only yellow-red light.

In general, light enters the window of the photo multiplier tube and impinges on a photo cathode which emits electrons in response thereto. The electrons in turn collide with a dynode within the photo multiplier tube which is a secondary electron emitter element. Each electron colliding with the dynode causes many more electrons to be emitted from the dynode. Each photo multiplier tube includes a plurality of dynodes. A predetermined supply voltage must be maintained between the cathode and the first dynode, between subsequent adjacent dynodes, and between the last dynode and the collecting electrode or anode.

Figure 7:
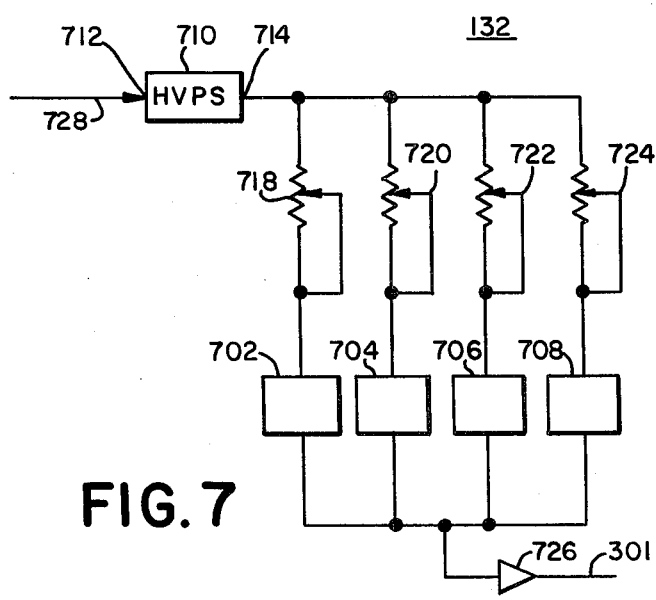
FIG. 7 is a more detailed block diagram of the detector assembly portion of the scanning apparatus of FIG. 3.

The photo multiplier tube assembly 132 of FIG. 7 further comprises a high voltage power supply 710 to provide the necessary supply voltage to the photo multiplier tube. Power supply 710 is equipped with a voltage programmable input terminal 712. In the preferred embodiment, the gain between the high voltage power supply output terminal 714 and the programmable input terminal is preset to 150, i.e. for a $-5$ volt input there is an output of $-750$ volts. The high voltage power supply 710 may be a model number HM1500N made by EMI Gencom Incorporated. The output supply voltage of the high voltage power supply 710 is trimmed separately for each of the photo multiplier tubes 702 through 708 to control the gain thereof. Trimming is accomplished by attenuating the supply voltage by adjusting pots 718, 720, 722 and 724 respectively. The simultaneous output of all photo multiplier tubes is summed in a preamplifier 726 and fed to the circuit of the present invention. The gain of the photo multiplier tube assembly 132 is controlled by the supply voltage supplied by the high voltage power supply 710 which in turn is controlled by the programmable voltage at the input terminal 712 via line 728.

In at least one embodiment the anode current levels encountered on the PMTs for the different stated conditions is:

- dark current (no light on PMT)—$1 \times 10^{-8}$ amps
- laser spot on metal—$1 \times 10^{-6}$ amps
- laser spot on substrate—$1 \times 10^{-5}$ amps Ideally, the PMT anode current for the laser beam on metal would be equal to the dark current. However, it is much larger than the dark current because blue light emitted from the PCB, attenuated about 5,000:1 by filter 133, is still a significant signal. In addition, the yellow glass filter also fluoresces slightly when excited by the reflected blue light.

Using the above anode current definitions, a fluorescent conversion efficiency ratio, R, for a PCB is defined as $$R = \frac{S1}{S2} = \frac{\text{Anode current, laser beam on substrate}}{\text{Anode current, laser beam on conductor}}$$

R will not necessarily be the same value for all PCBs inspected. For example, in a group of 55 samples of PCBs, R varied from 6 to 30. Larger values of R mean that fewer digitizing errors will be made in detecting the location of the change from metal to substrate and vice versa on a PCB.

In order to determine at a particular instant in time (or at a particular position of the laser beam during a sweep) whether the laser is impinging on metallic conductor or substrate it is necessary to establish a digitizing threshold level between S1 and S2. Anode current below the threshold level is taken to mean that the laser is illuminating a metallic surface while anode current above the threshold level is taken to mean that the laser is illuminating substrate. Some errors will occur in this process and selection of the threshold level will determine the error rate for a given value of R. It is desirable to preselect a threshold level for the system which level remains fixed for all PCBs inspected. However, since R varies among PCBs, the threshold level for an acceptable error rate will also vary. The Automatic Level Control (ALC) circuit of the present invention overcomes this problem by providing substrate and conductor output signals associated with the anode signals for substrate and conductor respectively which output signals have the same value for all PCBs. An effective R, formed by the ratio of the substrate to conductor output signals, thus remains constant for all PCBs.

In the preferred embodiment, when the PCB 200 is mounted in the holder 102, the laser beam sweeps from edge 208 to edge 210 in a series of substantially parallel sweeps. The first sweep begins adjacent and parallel to edge 204 with succeeding sweeps being closer to edge 206 as the Y-axis table moves continuously from left to right along line and arrows 130.

The surface of PCB 200 includes a first area or calibration strip 212 and an adjacent but spaced apart second area or calibration strip 214. Calibration strip 212 comprises a rectangular metallic surface composed of the same material as the metallic surface making up the pattern 202. The calibration strip 214 comprises substrate of the PCB which is composed of the same material as the substrate surrounding the metallic conductor pattern 202. It will be understood that calibration strip 214 may be merely a specifically defined area of the substrate of PCB 200. The calibration strips or areas 212 and 214 are formed during the PCB manufacturing process and they serve as calibration strips for use with the circuitry of the present invention as subsequently described. After the PCB 200 is securely mounted in holder 102, a start command is initiated by a manual start button or program, transmitted to control signal generator 302 via lead 301 and the scanning apparatus enters a slew mode. In this mode, the Y-axis table 128 moves to a predetermined location along line and arrows 130. Then a second start command is initiated, transmitted to control signal generator 302 via line 301 and the scanning apparatus begins a scan mode. The Y-axis table remains fixed in the predetermined location arrived at during the slew mode for an approximately fourteen second adjustment period. During this period the scanning laser beam follows a path across the calibration strips 212 and 214.

Angular encoder 126 generates a zero reference signal before each start of scan of the laser beam across the PCB 200. With each zero reference signal counters (not shown) in a control signal generator 302 (FIG. 3) are reset and counting of clocking signals starts over. Forty microsecond pulses A and B are generated by generator 302 which correspond in time to the movement of the laser beam across the calibration strips 212 and 214. The calibration strips are located at predetermined spots in the PCB and the counters in generator 302 count from the zero reference signal, which occurs at a known location ahead of the PCB 200, to the calibration strip 212. The A pulse then begins and continues until the counter reaches a count corresponding to the time it takes the laser beam, sweeping at a known speed, to cross the strip 212, a known width. In a similar way the B pulse is generated during the sweep of the calibration strip 214.

The A and B pulses are generated with each laser sweep after a zero reference signal. The A and B pulses are required for generation of other control signals (FIGS. 6A and 6B) generated by control signal generator 302 for operation of the circuits of the present invention. However, the A and B pulses are enabled by an enable signal only during the adjustment interval. The enable signal is generated within control signal generator 302 in response to the second start command. After the adjustment interval a delay start command is generated by the control signal generator 302 in response to the second start command which delay start command eliminates the enable signal and starts movement of the Y-axis table. The A and B pulses are not enabled again until the second start command is given at the end of the slew mode for the next PCB to be inspected.

During the adjustment interval while the Y-axis table remains fixed in position, the laser beam continues to rotate following the same sweep path across the PCB including the strips 212 and 214. Three hundred and ten sweeps across the strips are as 31 groups of sweeps, each group containing ten sweeps. The reason for this will be described later. In FIGS. 6A and 6B the control signals generated by the control signal generator 302 during the initial sweep of the first group of laser beam sweeps across the strips 212 and, respectively 214 in the adjustment period are shown. Not all of these signals are repeated every sweep however for reasons which will be given hereinafter. All control signals are synchronous with a clock signal 304 (FIG. 3) which clock signal is also used to sample the output of the ALC circuit during sweeps of the laser beam. The control signals are derived from a PROM within circuit 302. Two counters, stepped by the clock signal within the A and B intervals, generate addresses for the PROM. Each of the PROM outputs are latched for the duration of one clock period.

Referring now to FIGS. 6A and 6B, at the same time that the laser beam is crossing conductor strip 212, the control signal generator 302 generates an A signal 600 having a first predetermined time interval corresponding to the time that it takes the laser beam to cross the strip 212. (In the preferred embodiment, this is approximately 107 master clock pulses or 40 microseconds.) After a short time interval corresponding to the space between the calibration strips 212 and 214, the laser beam sweeps across the dashed area 214 and circuit 302 generates a second timing signal, B signal 602, comprising a second predetermined time interval corresponding to the time it takes the laser beam to sweep across calibration strip 214. (Similarly, the second predetermined time interval is 107 clock pulses or 40 microseconds.

During the first half of the A pulse, the control signal generator 302 generates sample and hold enable signal 604. The sample and hold enable signal is slightly less than 20 microseconds in duration, terminating at or just before the mid point of the A signal respectively. It is repeated in every laser sweep. During the initial laser sweep of the first group of sweeps across strips 212 and 214 during the adjustment period, the control signal generator 302 also generates load pulses 608 and 610. Thereafter, load pulse 608 is generated during every laser sweep. Load pulse 610 is generated only once, in the initial sweep of the first group. Each of the load pulses 608 and 610 is approximately 3 microseconds in duration in the preferred embodiment and starts 4 clock pulses after the start of the A and B signals 600 and 602 respectively.

During the latter half (last 20 microseconds) of the A signal, circuit 302 generates a first series of up/down counter signals designated generally 612 and a first series of counter clock signals designated generally 614. These are repeated every laser sweep. For every up/down counter signal in the series 612 there is an associated simultaneously occurring counter clock signal. Each counter clock signal has a narrower pulse width than its associated up/down counter signal, and each counter clock signal occurs within the time period of each up/down counter signal. In the preferred embodiment, there are seven signals in each of the series 612 and 614. During the latter half (last 20 microseconds) of the B signal, circuit 302 generates a single up/down counter signal 616 and a corresponding single counter clock signal 618. The signals 616 and 618 are only repeated during the initial sweep of each group of ten sweeps.

The signals generated during some of the 310 sweeps of the laser beam across the strips 212 and 214 during the adjustment period are represented in FIG. 8. FIG. 8 shows sweeps 801, 802, 803 and 810 from group 1, the initial group; sweep 811, the initial sweep of the second group; and sweeps 8309 and 8310, the last two sweeps of the final group of 31. After the 310th sweep, the delay start command (not shown) is transmitted from the control signal generator 302 to start movement of the Y-axis table 128 so inspection of the PCB can begin. Note that only in sweep 801 is there present a load pulse 610. In the last nine sweeps of each group of ten, there are no control signals generated during the duration of signal 602. During the initial sweep of each group of ten, for example, sweeps 801 and 811 in FIG. 8, control signals 616 and 618 are generated and transmitted from the control signal generating circuit 302.

The operation of FIG. 3 will be described in connection with the time intervals associated with the A and B signals 600 and 602. In general, the photomultiplier tube assembly 132 generates anode current signals associated with reflections of the laser light from conducting elements on the printed circuit board, or anode current signals associated with fluorescence of the substrate when the substrate is illuminated by the laser light. These signals will be referred to hereinafter as conductor signals and substrate signals respectively. During the A signal interval the laser light impinges on the calibration conducting strip 212 and the photomultiplier tube assembly 132 generates and transmits a signal hereinafter referred to as a calibration conductor signal. When the laser beam passes across the substrate calibration strip 214, the photomultiplier tube assembly 132 generates and transmits a signal hereinafter referred to as a calibration substrate signal. Remember the A and B pulses are generated by the control circuit 302 to correspond to movement of the laser beam across the strips 212 and 214, respectively.

During interval A, the calibration conductor signal is transmitted via lead 303 through a filter circuit 305 to a first sample and hold circuit 306. First filter circuit 305 is a low pass filter which filters out unwanted high frequency noise components present in the signals generated by the photomultiplier tube assembly 132. Filter 305 is a two pole, Bessel type active filter with unity gain. The first sample and hold circuit 306 is enabled to receive the calibration conductor signal during the first half (approximately 20 microseconds) of the A signal in response to the sample and hold enable signal 604 transmitted via lead 308 from the circuit 302. At the end of the sample and hold enable signal 604, the first sample and hold circuit 306 transmits a sample of the calibration conductor signal via line 310 to a first comparator circuit 312.

Also during time interval A, first reference means 316 generates a first reference signal in response to load signal 608 received from circuit 302 via lead 314. The first reference signal is transmitted via lead 318 to the comparator circuit 312. Comparator circuit 312 compares the levels of the sample of the calibration conductor signal on lead 310 and the first reference signal on lead 318 and generates a correction signal in response thereto. During the latter half of the A time interval, circuit 302 transmits the up/down counter signals 612 to the first comparator circuit 312 over lead 319 and transmits the counter clock signals 614 to the first reference circuit 316 over lead 315. With each up/down counter signal received, the circuit 312 transmits a correction signal via lead 320 to the first reference means 316. During the time that an up/down signal 612 is present on lead 319, first reference means 316 receives a counter clock signal. In response thereto, the first reference means adjusts the level of the first reference signal in accordance with the state of the correction signal. In response to the new level of the first reference signal on lead 318, the comparator circuit 312 makes a new comparison between the level of the first reference signal and the sample of the calibrated conductor signal on lead 310. Then, with the next up/down counter signal, the comparator transmit a new correction signal on lead 320 to circuit 316 which in turn adjusts the level of the first reference signal upon arrival of a counter clock signal on lead 315. This continues for the remainder of the time interval A while the series of up/down counter signals 612 and counter clock signals 614 are transmitted from the control signal generator 302.

At the end of each time interval A, the adjustment of the level of the first reference signal ceases and a fixed level first reference signal is available via lead 322 to a summing circuit designated generally 324. The action of the comparator circuit 312 during the latter part of the time interval A causes the level of the first reference signal to match within the quantization error the level of the sample of the calibrated conductor signal.

During the time interval B (signal 602), the laser beam is crossing the substrate calibration strip 214. Accordingly, the photomultiplier tube assembly 132 transmits the calibration substrate signal via lead 326 to a second input terminal of the summing circuit 324. Summing circuit 324 provides a summed output signal associate with the calibration substrate signal over a lead 328 to a second filter circuit 330 which is identical in design and purpose to first filter circuit 305. The summed output signal present on lead 328 during the B time interval is a sum of the calibration substrate signal and the fixed level first reference signal. From the second filter circuit 330, the summed calibration substrate signal is transmitted via a line 332 to a comparator circuit 334. Comparator circuit 334 compares the level of the signal on lead 332 to a preselected signal level and generates a correction signal in response thereto.

Figure 3:
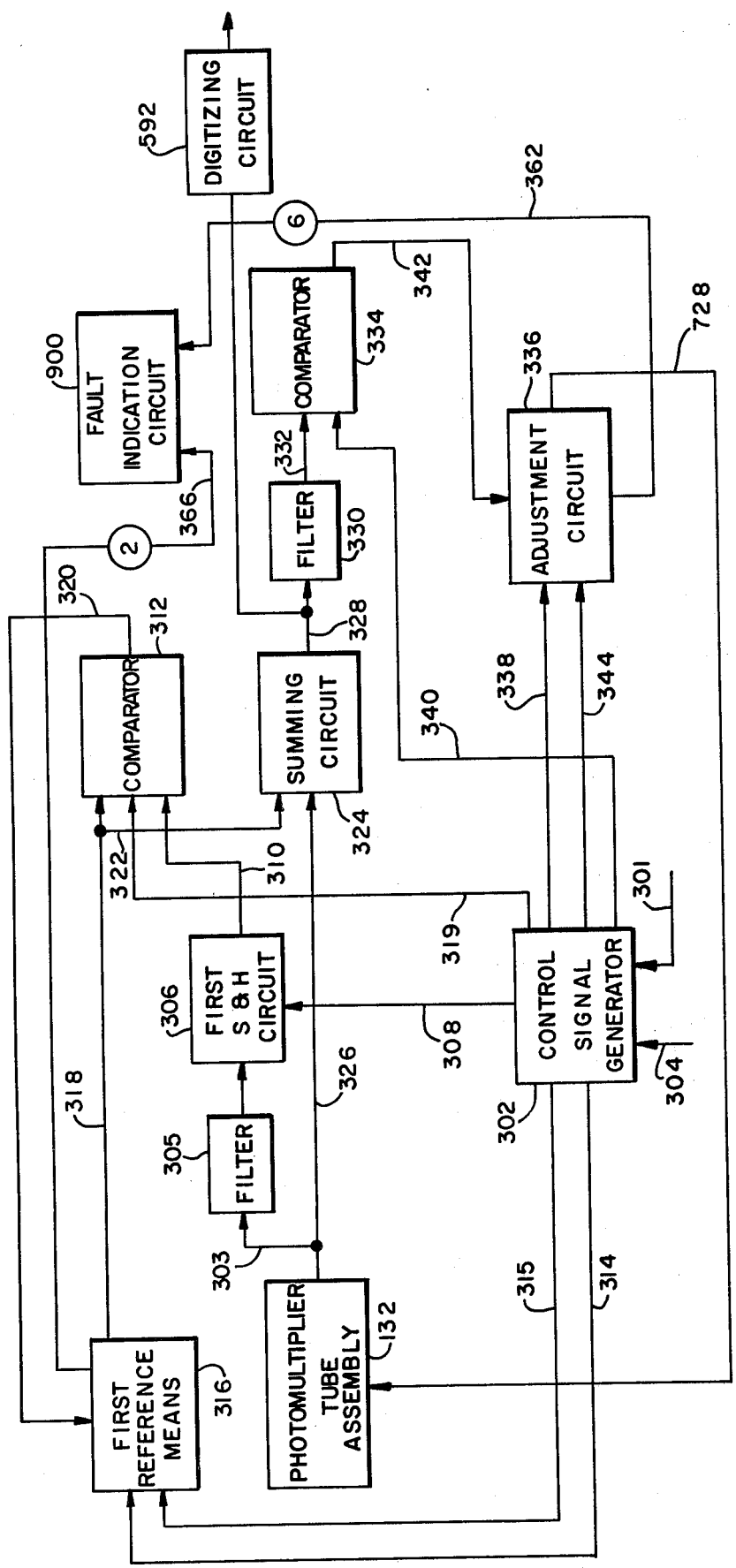
FIG. 3 is a block diagram of a preferred embodiment of the present invention.

Operation of the remaining portion of the circuit of FIG. 3 during time interval B (signal 602) depends on the presence of control signals from the circuit 302. Whether any control signals are present depends on which sweep of the 310 sweeps of the laser beam of the adjustment period is occurring.

During sweep 801 for example in the beginning of B time interval, an adjustment circuit 336 generates an initial adjustment signal in response to the load pulse 610 transmitted from circuit 302 via lead 338. During the latter half of the B time interval 602 in sweep 801, up/down counter signal 616 is transmitted via lead 340 to comparator circuit 334. In response thereto, circuit 334 transmits a correction signal via lead 342 to adjustment circuit 336. At the same time that signal 616 is transmitted to comparator circuit 334, counter clock signal 618 is transmitted via lead 344 to adjustment circuit 336. In response to this signal, adjustment circuit 336 increases or decreases incrementally the adjustment value stored therein in accordance with the state of the correction signal present on lead 342. The adjustment signal is transmitted via a lead 728 to the voltage programmable input terminal 712 of the high voltage power supply 710 of photomultiplier tube assembly 132. In response to the level of the adjustment signal, the high voltage power supply 710 changes the level of its output voltage which output voltage is distributed to the photomultiplier tubes 702–708. This changes the response of the photomultiplier tubes so that for a given excitation the conductor and substrate signals generated therein may be varied.

The change induced in the level of the conductor and substrate signal levels as a result of a single incremental change in the level of the adjustment signal within the adjustment circuit is not enough, in general, to bring the level of the summed calibration substrate signal nearly equal to the preselected signal level. Hence, further adjustments to the high voltage power supply are required to further change the level of the conductor and substrate signals generated by the photomultiplier tubes. However, the output voltage of the high voltage power supply does not change instantaneously in response to a change in the voltage at the programmable voltage input terminal 712. In the preferred embodiment, the laser beam completes a revolution in 45 milliseconds. It takes the high voltage power supply at least 450 milliseconds to stabilize its output. Accordingly, a new adjustment signal can not be transmitted to the high voltage power supply with each laser sweep of the calibration strips 212 and 214.

In the preferred embodiment a new adjustment signal is transmitted to the high voltage power supply every tenth laser beam sweep. For this reason the up/down pulse 616 and the counter clock pulse 618 occurring during the B time interval are transmitted every tenth laser sweep during the initial sweep of each group of sweeps. Note once again in FIG. 8 that sweeps 801 and 811 show the presence of the pulses 616 and 618 but the intermediate sweeps 802, 803, etc. do not. In the very beginning of the adjustment period the load pulse 610 is transmitted to the adjustment circuit to load an initial adjustment signal having a preselected initial signal level therein.

However, throughout the remaining sweeps of the adjustment period it is not desirable to provide other load signals (610) to the adjustment circuit since this would load the initial adjustment signal back into the adjustment circuit canceling out the adjustments made by the correction signals from the comparator circuit. Since a change in the high voltage power supply affects the photomultiplier tubes, the conductor signal levels are also changed along with the substrate signal level. However, the change in the conductor signal is compensated for in a different way. As described above the first reference means 316, the first sample circuit 306, and the comparator circuit 312 operate to adjust the level of the first reference signal to match the level of the conductor signal during each sweep of the laser beam during the A time interval.

It should be remembered that after the adjustment period comprising 310 laser beam sweeps, the control signal generator 302 generates a delayed start signal, which is applied by a circuit not shown, to start movement of the table 128. The laser then begins progressive scanning of the printed circuit board. Photomultiplier tube assembly 132 now transmits a plurality of mixed conductor and substrate signals in response to the scanning of the printed circuit board. These signals are transmitted via lead 326 to the summing circuit 324 where they are summed with the fixed level first reference signal on line 322. The result is a series of summed output signals comprising summed conductor signals, whose levels are, or nearly are, at zero signal level, and summed substrate signals whose levels are, or nearly are, the same as the preselected substrate signal level.

By adjusting the first reference signal to provide a near zero summed output signal from summing circuit 324 in response to conductor input signals on lead 326, and by adjusting the high voltage power supply 710 to cause the photomultiplier tubes 702-708 to provide adjusted substrate signals with a level such that summed substrate signals from summing circuit 324 have a level the same or nearly the same as the preselected substrate signal level, the circuit of the present invention overcomes the difficulties previously associated with inspecting circuit boards with varying characteristics.

Figure 4:
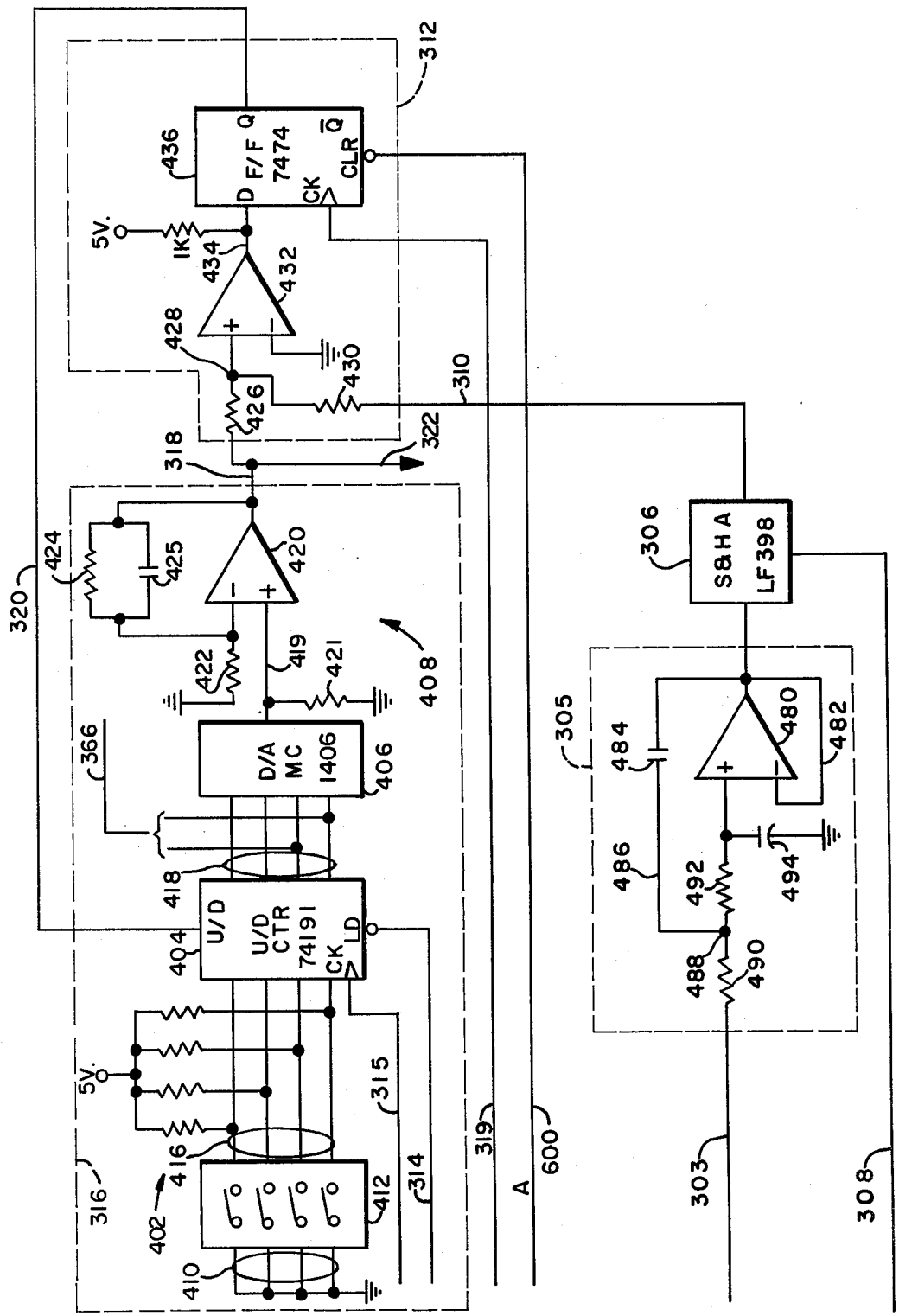
FIG. 4 is a more detailed block diagram of the first reference means and the first correction means portions of the block diagram of FIG. 3.

FIG. 4 illustrates in greater detail the first reference means 316, filter 305, the first sample and hold circuit 306 and the first comparator 312. The first reference means 316 further comprises an initializing circuit designated generally 402; an up/down counter 404; a digital to analog (D/A) converter 406; and an amplifier circuit designated generally 408. The initializing circuit 402 has four parallel input leads 410 which are connected to ground at one end and connected to one side of four switches located within a switch assembly 412 at the other end. It further comprises four parallel output leads designated 416 connected to the other side of the switches in switch assembly 412. The four output leads 416 are connected through 1K resistors to a five volt power supply and to four input terminals of the up/down counter 404. As long as the switches in assembly 412 are open, the four output leads 416 are in the high state and represent four high signals into up/down counter circuit 404. If any of the switches are closed then the associated output lead is pulled down to the low state since the output lead is then connected to ground through the closed switch. By manually selecting which of the switches in assembly 412 are open and which are closed, any one of sixteen different initial levels can be preselected for loading into the up/down counter 404. In the preferred embodiment counter 404 is a 74191 TTL device.

Up/down counter 404 is connected via four parallel output leads 418 to the inputs of D/A converter 406. In the preferred embodiment, converter 406 is a Motorola MC 1406 device which generates and transmits a current signal over lead 419. The level of the current signal varies from zero to −2 milliamps depending on the level of the four bit input signal on leads 418. When the four input signals are all low, converter 406 provides a −2 milliamp signal.

The output of D/A converter 406 is connected via a lead 419 to the noninverting input of an operational amplifier 420. Lead 419 is also connected to ground through a 100 ohm resistor 421. The inverting input of amplifier 420 is connected to ground through a 1K resistor 422. The output of amplifier 420 is connected to its inverting input through a feedback circuit including a 4.99K resistor 424 and a 5 pf capacitor 425 connected in parallel. The negative current of the converter 406 through resistor 421 develops a negative input voltage to the noninverting input of operational amplifier 420. With the configuration of circuit 408 shown in FIG. 4 the output of D/A converter 406 is amplified by a factor of approximately 6 to 1. The output of circuit 408 on lead 318 is a negative voltage called the first reference signal.

The first reference signal is transmitted through a 1K resistor 426 to a junction 428. The other input to junction 428 is a positive voltage representing a sample of the calibration conductor signal transmitted from first sample and hold circuit 306 via lead 310 through a 1K resistor 430. Sample and hold circuit 306 receives the calibration conductor signal after it has been filtered by first filter circuit 305 which comprises operational amplifier 480. The output of operational amplifier 480 is fed back directly to its inverting input via a lead 482. The output is also fed back through a 2,000 pf capacitor 484 via lead 486 to a junction 488 formed between a pair of 3.6K resistors 490 and 492. One end of resistor 490 is connected to junction 488 while its other end is connected to lead 303 from the photomultiplier tube assembly 132. One end of resistor 492 is connected to junction 488 and the other end is connected to the noninverting input of operational amplifier 480. The noninverting input to operational amplifier 480 is tied to ground through a 1500 pf capacitor 494. The function of the filter circuit 305 was described earlier.

First sample and hold circuit 306 comprises a National Semiconductor LF398 sample and hold device. It samples the output of filter circuit 305 during the presence of the sample and hold enable signal 604 on lead 308.

Junction 428 is connected to the noninverting (positive) input of voltage comparator 432. The inverting (negative) input of voltage comparator 432 is grounded. The output of comparator 432 is connected by a lead 434 to the D input of a flip-flop 436.

Resistors 426 and 430, comparator 432, and D flip-flop 436 comprise the comparator circuit 312. The configuration of comparator circuit 312 in FIG. 4 represents a ground state comparator. In this configuration, the comparator 432 saturates when even a minute positive input voltage is present at the positive or noninverting terminal. If the value of the negative first reference signal through resistor 426 exceeds the value of the positive signal from the sample and hold circuit 306 through resistor 430 by even a small amount then a low binary signal is transmitted from amplifier 432 to D flip-flop 436. If the signal from the sample and hold circuit 306 exceeds the value of the first reference signal by even a small amount then a high binary signal is provided to D flip-flop 436.

The operation of the circuit of FIG. 4 will be described in connection with the control signals of FIG. 6. During the first 20 microseconds of the A time interval, the load signal 608 is applied over lead 314 to the load input of counter 404 and loads the manually selected signal in initialization circuit 402 into the counter. This four bit signal is converted to an analog signal by D/A converter 406, amplified by amplifier 420 and transmitted to junction 428. During the same 20 microseconds, the photomultiplier tube assembly 132 transmits the calibration conductor signal through first filter circuit 305 to sample and hold circuit 306. The sample and hold enable signal 604 is applied via lead 308 to sample and hold circuit 306 to enable circuit 306 to sample and store a representation of the calibrated conductor signal. During the latter 20 microseconds of the time interval A, sample and hold circuit 306 transmits the representativ sample of the calibrated conductor signal to junction 428. Comparator 432 provides a positive or negative signal to D flip-flop 436 depending on the relative levels of the sample calibration conductor signal and the first reference signal. Also, during the latter 20 microseconds of the A time interval, the series of up/down counter signals 612 are transmitted over lead 319 as clocking signals to D flip-flop 436 and the series of synchronously occurring counter clock signals 614 are transmitted as clocking signals over lead 315 to the up/down counter 404.

Each time the D flip-flop is clocked, either a high or low correction signal is transmitted via line 320 to the up/down input of counter 404. In response to a counter clock signal, the counter incrementally increases or decreases (depending on the level of the correction signal) the value of the four bit signal stored within counter 404. The new output of counter 404, either higher in value or lower, is converted to analog, by D/A converter 406, amplified by amplifier 420 and compared at summing junction 428 with the level of the sample of the calibration conductor signal from sample and hold circuit 306. This provides a new input, either high or low to D flip-flop 436. The above process repeats with the occurrence of each new up/down counter signal and counter clock signal respectively. Eventually, the level of the first reference signal is adjusted within the quantization error to the level of the sample of the calibration conductor signal.

The trailing edge of the A pulse 600 clears flip flop 436.

Figure 5A:
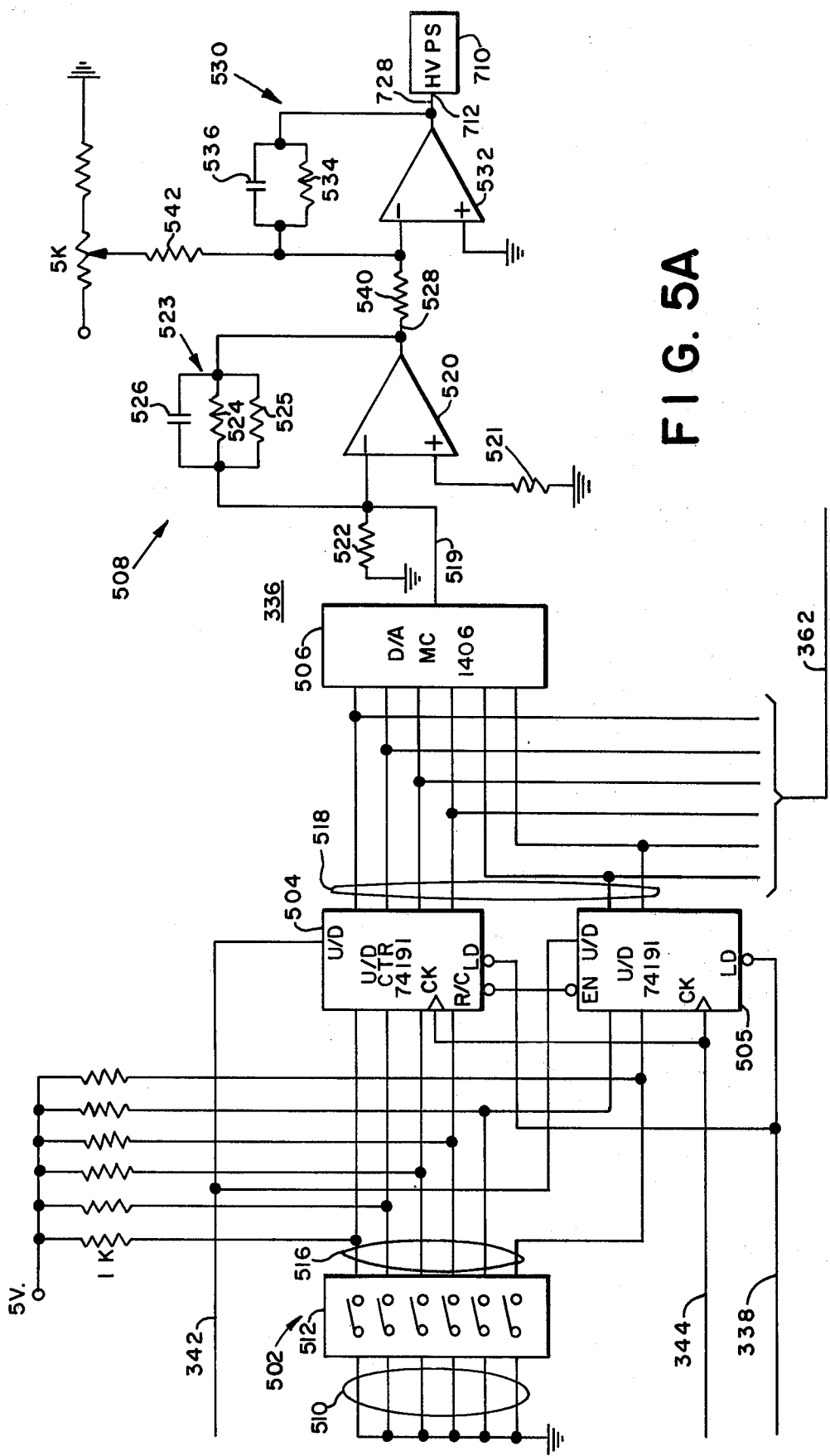
FIG. 5A is a more detailed block diagram of the adjustment means portion of the preferred embodiment block diagram of FIG. 3.

FIG. 5A shows in greater detail the adjustment circuit 336 of FIG. 3. The adjustment circuit 336 comprises an initializing circuit 502; a pair of up/down counters 504 and 505; a D/A converter 506; and a current-to-voltage converter circuit designated generally 508. The initializing circuit 502 has six parallel input leads 510 which are connected between ground and one side of six manually settable switches 512. It further comprises six parallel leads designated 516 connected to the other side of the switches 512 with the six output leads being connected through 1K resistors to a five volt power supply. The four input terminals of the up/down counter circuit 504 and two of the four input terminals of the up/down counter circuit 505 are connected to the output leads 516. As long as the switches 512 are open, the six leads 516 are at the high level and represent six high signals into the up/down counters 504 and 505. If any of the switches are closed then the associated lead is pulled down to the low state as a result of being connected to ground through the closed switch. By manually selecting which of the switches 512 are open and which are closed, any one of 64 different initial levels can be preselected for loading into the up/down counters 504 and 505. In the preferred embodiment, counters 504 and 505 are 74191 TTL devices.

Up/down counters 504 and 505 are connected via six parallel output leads 518 to D/A converter 506. In the preferred embodiment, converter 506 is a Motorola MC1406 device which generates and transmits a current signal over lead 519. The level of the current signal varies from zero to −2 milliamps depending on the level of the six bit input signal on lead 518. When the six input signals are all high, converter 506 provides a zero milliamp current signal; when the six input signals are all low the converter 506 provides a −2 milliamp signal.

Lead 519 from D/A converter 506 is connected to the current-to-voltage converter circuit 508 which comprises an operational amplifier 520, a 100 ohm resistor 521, a 100 ohm resistor 522 connected between ground and the inverting (negative) input terminal of amplifier 520, and feedback circuitry designated generally 523 including a pair of 1.3K resistors 524 and 525 a 5 pf capacitor 526 connected in parallel between the output of operational amplifier 520 and its inverting input. The negative current of the converter 506 through resistor 522 from ground develops a negative input voltage to the inverting input of operational amplifier 520. The current to voltage converter 508 provides a relatively high voltage output signal for a very small current input signal with very little loss of the input current signal. The feedback resistors 524 and 525 are shunted with the capacitor 526 in order to remove high frequency noise and interference at the output of the operational amplifier 520. With the configuration of circuit 508 shown in FIG. 5A the output of D/A converter 506 is converted from a small negative current signal into a positive voltage signal. The output of the current to voltage converter circuit 508 is transmitted via lead 528 to an adjustment circuit output amplifier circuit designated generally 530. The output amplifier circuit 530 comprises an operational amplifier 532, the noninverting input of which is grounded. The output of the operational amplifier 532 is fed back through a 10K resistor 534, connected in parallel with a 100 pf capacitor 536, to the inverting input of the amplifier. Lead 528 is connected through 10K resistor 540 to the inverting input of the amplifier 532. In addition, a 5K pot is connected through a 10K resistor 542 to the inverting input of amplifier 532. The output signals from the output amplifier circuit 530, called adjustment signals, are applied to the voltage programmable input terminal 712 of the high voltage power supply 710 over lead 728. The 5K pot and 10K resistor 542 connected to the inverting input of the amplifier 532 provide a minimum voltage input to the high voltage power supply 710 should the substrate signals generated by the photomultiplier tube assembly 132 have a high signal level.

Figure 5B:
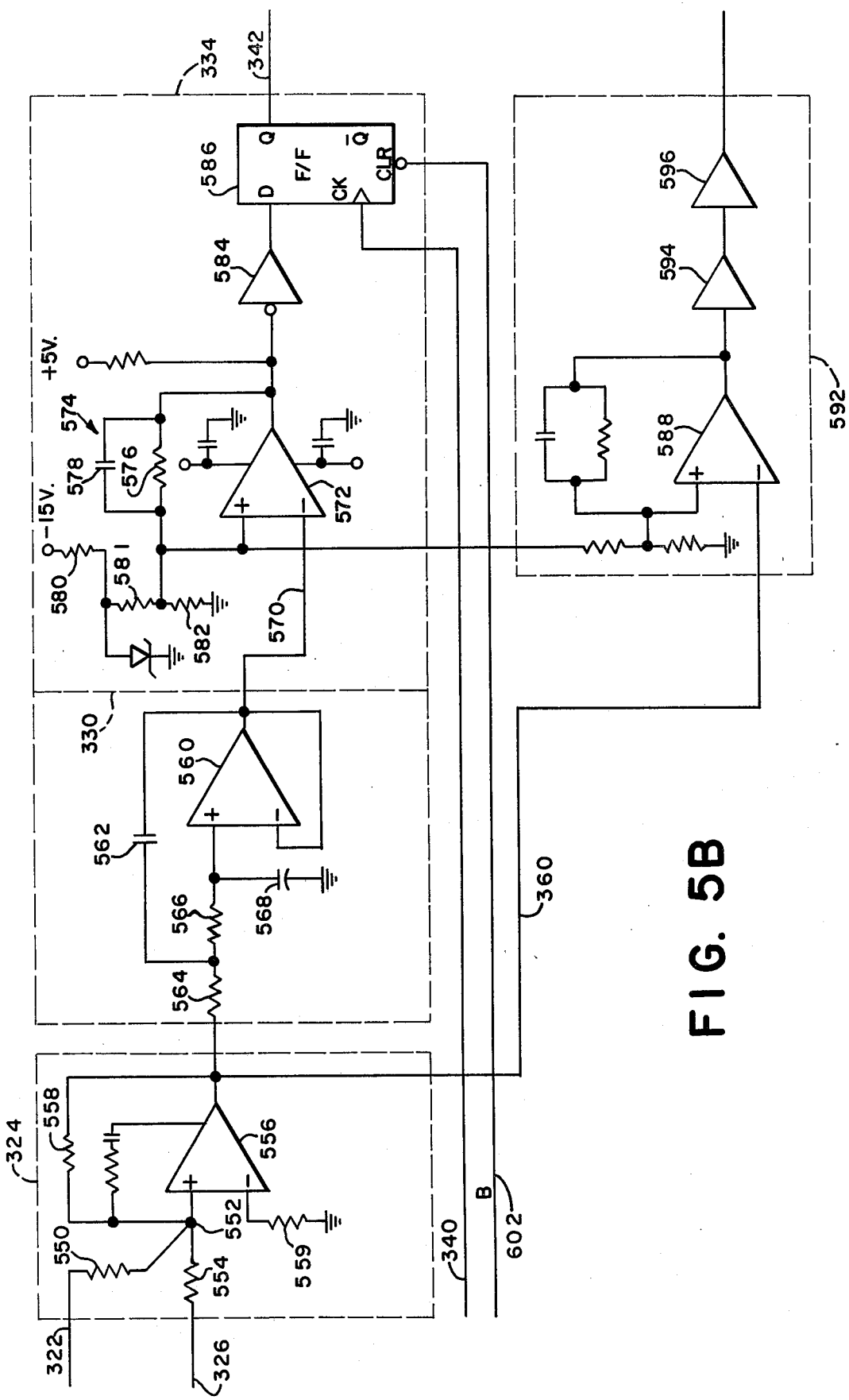
FIG. 5B is a more detailed block diagram of the summing means and second comparator means portions of the preferred embodiment block diagram of FIG. 3.

FIG. 5B shows details of the summing circuitry 324, filter 330 and comparator 334. The first reference signal from amplifier 420 in FIG. 4 is transmitted via lead 322 and a 5.1K resistor 550 to summing junction 552. Signals from photomultiplier tube assembly 132 are transmitted via lead 326 through a 5.1K resistor 554 to summing junction 552. Summing junction 552 is connected to a National Semiconductor LM318 operational amplifier 556 whose output is fed back through a 5.1K feedback resistor 558 to the summing junction 552. The noninverted input terminal of the operational amplifier is grounded through a 1K resistor 559. With this arrangement the negative first reference signal on line 322 will be added with the positive signals received from the photomultiplier tube assembly on line 326. The summed signals will appear inverted and with unity gain at the output of operational amplifier 556. The summed signals are transmitted through second filter circuit 330 which is identical in design to filter circuit 305. Circuitry 330 comprises operational amplifier 560, a feed back capacitor 562, input resistors 564 and 566 and a capacitor 568.

The filtered, summed output signals from second filter circuitry 330 are transmitted via lead 570 to the comparator circuitry 334. Comparator circuitry 334 comprises an operational amplifier 572, a feedback circuit 574, an inverter 584 and a D flip flop 586. Lead 570 is connected to the inverting input terminal of amplifier 572 while the output of the amplifier is connected through feedback circuit 574 to the noninverting input. Feedback circuit 574 comprises a 56K resistor 576 connected in parallel with a 1.5 pf capacitor 578. A preselected substrate voltage is provided to the noninverting input terminal of amplifier 572 through the arrangement of resistors 580, 581 and 582 and a −15 volt power supply. In the preferred embodiment the preselected substrate voltage is −3.5 volts. The output of operational amplifier 572 is transmitted through the inverter 584 to the D input of D flip flop 586. The Q output of flip flop 586 transmits correction signals to the up-/down counters 504 and 505 via line 342.

Operation of the circuit of FIGS. 5A and 5B will now be given in connection with the control signals of FIG. 6. During the first 20 microseconds of the B time interval of laser sweep 801, load signal 610 on lead 338 loads the manually selected value set up in switches 512 into the up/down counters 504 and 505. This six bit value is converted to an analog signal by D/A converter 506, converted to a voltage signal by circuit 508 and transmitted to the inverting input terminal of output amplifier circuit 530. The output of amplifier circuit 530 is transmitted on lead 728 as a control signal to the high voltage power supply 710. During the same 20 microseconds, the photomultiplier tube assembly 132 transmits a calibration substrate signal over lead 326 and through resistor 554 to summing junction 552. This is a positive voltage signal which is summed at junction 552 with a negative first reference signal on line 322. The summed signal is inverted with unity gain by the operational amplifier 556 and transmitted through second filter circuit 330. The filtered summed calibration substrate signal is then provided via lead 570 to the inverting input terminal of operational amplifier 572 where its signal level is compared with the −3.5 V preselected substrate voltage applied to the noninverting input terminal of operational amplifier 572. If the summed calibration substrate signal is more negative than −3.5 volts then operational amplifier 572 will provide a high signal which is inverted by inverter 584 to provide a low signal to the input of flip flop 586. If the summed calibration substrate signal has a signal level less negative than −3.5 volts then a low signal is provided to inverter 584 which is inverted to a high input to the D input of flip flop 586.

During the latter 20 microseconds of the B time interval, up/down pulse 616 is transmitted over lead 340 to the clocking input of D flip flop 586 and the counter clock pulse 618 is transmitted over lead 344 to the inputs of up/down counters 504 and 505. When D flip flop 586 is clocked, either a high or low correction signal is transmitted via lead 342 to the up/down inputs of counters 504 and 505. In response to a counter clock signal 618, the value of the six bit signal stored within the counters 504 and 505 is either incremented or decremented depending on the state of the correction signal. The new signal, either higher or lower, is converted to analog, converted to a voltage signal, and provided to the inverting input terminal of output amplifier circuit 530. Output amplifier circuit 530 transmits the adjustment signal via lead 728 to the voltage programmable input terminal of the high voltage power supply 710. In turn the high voltage power supply changes its output supply voltage to the photomultiplier tubes 702 through 708. In response to a different supply voltage, the photomultiplier tubes change the level of the substrate signal generated within. With the remaining nine laser beam sweeps occurring in the first group of laser beam sweeps in the adjustment period (sweeps 802 through 810 in FIG. 8) the output voltage of the high voltage power supply is allowed to stabilize. No new clocking signals are sent to the D flip flop 586 or to the up/down counters 504 and 505. With each initial laser beam sweep of each group of ten within the thirty-one groups of the adjustment period, a single up/down counter signal 616 and single counter clock signal are transmitted to the flip flop 586 and counters 504 and 505, respectively. However, no new load signal 610 is provided to the counters 504 and 505 during the subsequent initial laser beam sweeps. Eventually, the level of the calibrated summed substrate signal is adjusted to nearly equal the level of the preselected substrate signal value (−3.5 v) applied to the noninverting input of operational amplifier 572.

At the end of the adjustment period several things happen. Adjustment of the level of the summed calibrated substrate signal ceases and the value of summed substrate signals transmitted from the summing circuit 324 in response to substrate signals from the photomultiplier tube assembly 132 becomes fixed. The laser beam begins scanning the pattern of the conductors on the substrate and the photomultiplier tube assembly 132 provides both conductor and substrate signals to the summing junction 552 whereat the conductor and substrate signals are summed with the fixed value first reference signal. If a positive conductor signal is present in junction 552 then it combines with the first reference signal of near equal value and opposite polarity to provide a near zero signal. If a substrate signal is provided at junction 552 then it is summed with the first reference signal to produce non zero signals. The summed conductor and substrate signals are then transmitted via lead 360 to a digitizing circuit designated generally 592.

Digitizing circuit 592 comprises an operational amplifier 588 with a constant preselected threshold voltage provided to the noninverting input. The summed output signals from summing circuit 324 are applied to the inverting input of amplifier 588. In the preferred embodiment, the threshold voltage level is 0.8 to 0.9 volts. If a summed output signal on lead 360 is near zero, the amplifier 588 will provide a low level binary logic signal to a pair of serially connected inverters 594 and 596. If the summed output signal is −3.5 volts then the amplifier 588 will provide a high level binary logic signal to the inverter pair. Hence, for all printed circuit boards tested, the circuit of the present invention provides low logic level signals when scanning conductors and high logic level signals when scanning substrate.

The output of inverter 596 may be applied to preprocessing circuitry which operates on the output signals to eliminate errors arising in the scanning apparatus and digitizing process. From there the signals containing information about the metallic pattern may be sent to a data utilization means where the signals are used to locate discrepancies that may be present in the metallic pattern.

If a different circuit board is now placed in the scanning apparatus 100, the circuit of the present invention will once again adjust the first reference signal to match the conductor signal of the new circuit board; and adjust the high voltage power supply of the photomultiplier tube assembly such that summed substrate signals will equal the preselected substrate voltage level. Regardless of the level of the uncorrected conductor and substrate signals for a given printed circuit board (within the limits of the adjustment of the up/down counter 404 and 504 and 505), the circuit of the present invention provides near zero and near −3.5 volt signals representative of conductor and substrate signals respectively.

Figure 9A:
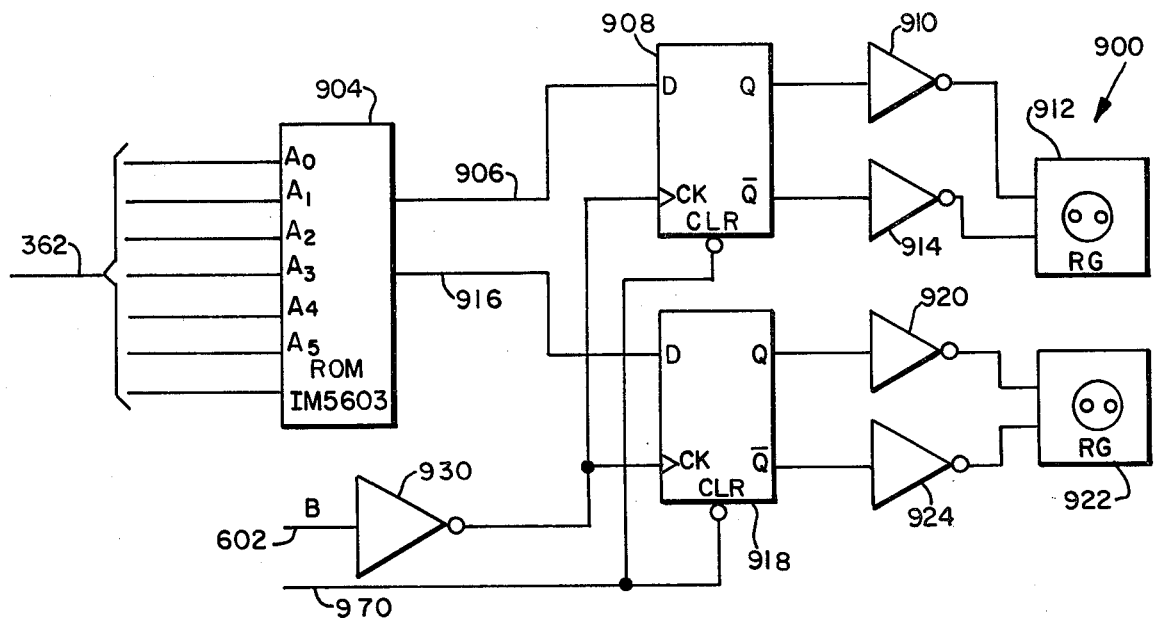
FIG. 9A is a more detailed block diagram of a first portion of the fault detection portion of the preferred embodiment block diagram of FIG. 3.
Figure 9B:
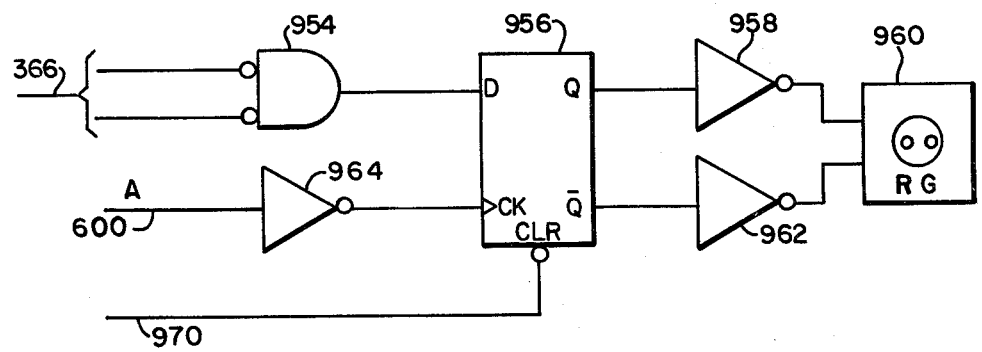
FIG. 9B is a more detailed block diagram of a second portion of the fault detection portion of the preferred embodiment block diagram of FIG. 3.

FIGS. 9A and 9B show details of the fault indication circuit 900. To determine if the signal resulting from scanning the substrate on a PCB is within permissible limits, output leads 518 from up/down counters 504 and 505 in FIG. 5 are connected via parallel leads 362 to the address input terminals A0–A5 of a read only memory (ROM) 904. In the preferred embodiment, ROM 904 is an Intel Model Number IN 50603 device. A first output of ROM 904 is connected by a lead 906 to the D input of a D flip flop 908. The Q output of the flip flop 908 is passed through an inverter 910 and applied to the red input terminal of a red/green LED indicator 912. The $\overline{Q}$ output of flip flop 908 is passed through an inverter 914 to the green input terminal of red/green indicator 912.

A second output from ROM 904 is connected by a lead 916 to the D input of a D flip flop 918. The Q output of D flip flop 918 is passed through an inverter 920 to the red input terminal of red/green LED indicator 922. The $\overline{Q}$ output of D flip flop 918 is passed through an inverter 924 to the green input of red/green indicator 922.

If the level of the fluorescent signal emitted from the substrate of a particular printed circuit board in response to the laser beam impinging thereon is low, the circuit of FIGS. 5A and 5B will attempt to boost the output of the photomultiplier tube assembly by providing a high level adjustment signal from the amplifier circuit 508. This is accomplished as described before by incrementally changing the level of the digital signal stored in up/down counters 504 and 505. As the adjustment period continues and the substrate signal transmitted from the photomultiplier tube remain too low, eventually the signal level in the up/down counters 504 and 505 will be decremented to the point where the digital value stored therein is a 6-bit 0 signal. A 6-bit 0 signal applied to ROM 904 accesses a 2-bit location which stores a high signal for output lead 906 and a low signal for output lead 916. The high signal on line 906 is transmitted as a low signal to indicator 912 which will turn the red LED on. At the same time, a high signal will be transmitted to the green LED indicator in 912 turning it off. The red light indicator in 912 indicates that the substrate emits too low a fluorescent signal in response to the laser beam. Correspondingly, the low signal on lead 916 transmitted to D flip flop 918 causes a high signal to be transmitted to the red LED and a low signal to the green LED of indicator 922. This turns on the green light in indicator 922 indicating that the fluorescent emission from the substrate for this printed circuit board is not too high.

In a corresponding way, if the substrate emits too high a fluorescence in response to the laser beam, the circuit of FIGS. 5A and 5B will attempt to lower the level of the substrate signals transmitted from the photomultiplier tube assembly 132. It will do this by incrementing the count stored in counters 504 and 505. If the fluorescent signal remains too high as the adjustment period continues the 6-bit value stored in up/down counters 504 and 505 will reach a maximum of 31 manifested by all outputs from the counters being at the high level. When this occurs, it addresses an address in ROM 904 having values stored therein such that ROM 904 transmits a low signal on line 906 and a high signal on line 916. This turns off the green light in indicator 922 and turns on the red light indicating that too high a fluorescent signal exists. For all 6 values stored in up/down counters 504 and 505 other than a 0 or 63, ROM 904 produces low level signals on lines 906 and 916 causing the green lights in indicators 912 and 922 to be turned on. The clock for the D flip flops 908 and 918 is the B time interval signal 602 after inversion at inverter 930. Thus, after each B time (i.e., after each laser beam sweep across the region 214 in FIG. 2) the contents of the counters 504 and 505 are sampled for their contents.

To determine if the signal resulting from scanning a conductor on a PCB is within permissible limits, the two most significant bit output signals from the up/down counter 404 are applied via leads 366 to a NAND gate 954. The output of NAND gate 954 is connected to the D input of flip flop 956. The Q output of D flip flop 956 is inverted by inverter 958 and applied to the red input terminal of red/green indicator 960. The $\overline{Q}$ output of D flip flop 956 is inverted by inverter 962 and applied to the green input terminal of indicator 960. If the photomultiplier tube assembly transmits a conductor signal which is too high in response to the laser beam reflection from the conductor portion of the printed circuit board, the circuit of FIG. 4 will attempt to increase the level of the first reference signal transmitted from amplifier circuit 408. It will do this by decreasing the value of the digital signal stored in up/down counter 404. If, as the adjustment period continues, the level of the signal emitted from the photomultiplier tubes is still too high the 4-bit signal stored in up/down counter 404 will be decremented until the two most significant bits are at the low binary level. The two most significant bits of the 4-bit signal are transmitted via leads 366 to NAND gate 954. These two low signals will cause a high signal to be transmitted to flip-flop 956 which in turn provides a low signal via inverter 958 to the red input of the indicator 960. This turns on the red light and turns off the green light. A red light from indicator 960 indicates that the return signal level from the conductor pattern on the printed circuit board is too high. In an alternate embodiment, it may be that counter 404 is to be decremented until all four bits stored in counter 404 are zero before the red LED in indicator 960 is turned on. However, in the preferred embodiment the conductor copper signal is too high if the value stored in counter 404 is as low as a count of three. The clock for the D flip flop 956 is the A time interval signal 600 after inversion at inverter 964.

Flip-flops 908, 918 and 956 in FIGS. 9A and 9B are cleared via lead 970 at the start of each adjustment period before the A signal of the first laser beam sweep by a clear signal not shown in FIG. 6A. If a red fault light is activated during the adjustment period it remains on until cleared at the start of a new adjustment period.

While the present invention has been disclosed in connection with the preferred embodiment thereof, it should be understood that there may be other embodiments which fall within the spirit and scope of the invention as defined by the following claims.

What is claimed is:

1. In a scanning apparatus which periodically sweeps a beam of light across a printed circuit board along a plurality of sweep paths, said scanning apparatus including detector means, responsive to radiation from the printed circuit board as it is swept by said beam of light and to an adjustment signal, for producing first and second signals indicative of whether a conductor portion or a substrate portion of said printed circuit board is being swept, the improvement comprising:

automatic level control means responsive to said first and second signals for providing level adjusted first and second output signals, the levels of which form a ratio, R, which is substantially the same for all printed circuit boards swept in said scanning apparatus, said automatic level control means including adjustment means coupled to said detector means for providing said adjustment signal.

2. The improvement as claimed in claim 1 wherein said automatic level control means comprises:

a first circuit means responsive to said first and second signals for producing said level adjusted first and second output signals, said level adjusted first output signals having a signal level which is substantially zero and said level adjusted second output signals having a signal level which is substantially the same as a preselected level.

3. The improvement as claimed in claim 2 wherein said first circuit means comprises:

first reference means responsive to at least one of said first signals for automatically producing a first reference signal with a signal level substantially equal to said at least one of said first signals; and summing means responsive to said first and second signals and said first reference signal for summing said first and second signals with said first reference signal to produce said level adjusted first and second output signals.

4. The improvement as claimed in claim 3 wherein said first reference means comprises:

first reference signal means for generating said first reference signal having an initial signal level;

first sampling means responsive to said at least one of said first signals for generating a first sample signal having a signal level substantially equal to said at least one of said first signals during a first time interval when only said at least one of said first signals is being produced by said detector means; and first comparator means responsive to said first reference signal and said first sample signal and coupled to said first reference signal means for generating and transmitting correction signals to said first reference signal means for changing the initial level of said first reference signal during said first time interval.

5. The improvement as claimed in claim 4 wherein said first reference signal means comprises:

first up/down counter means for initially storing a first initial signal having a first signal level and for increasing or decreasing the level of said first initial signal in response to said correction signals from said first comparator means.

6. The improvement as claimed in claim 2 wherein said first circuit means provides intermediate summed first and second output signals during an adjustment interval and wherein said adjustment means comprises:

a second comparator circuit responsive to said summed second output signals and to a fixed voltage input signal having a signal level substantially equal to said preselected level, said second comparator circuit for providing correction signals; and an adjustment circuit for generating and transmitting said adjustment signal to said detector means, the level of said adjustment signal being changed in response to said correction signals from said second comparator means during said adjustment interval, whereby the levels of said first and second signals are increased or decreased.

7. The improvement as claimed in claim 6 wherein said adjustment circuit comprises:

second up/down counter means for initially storing a second initial signal having a second signal level and for increasing or decreasing the level of said second initial signal in response to said correction signals from said second comparator means.

8. The improvement as claimed in claim 6 wherein said automatic level control means comprises:

fault detection means coupled to said first circuit means and said adjustment circuit for indicating when the level of said first signals are above a first predetermined maximum and when the level of said second signals are above a second predetermined maximum or below a predetermined minimum.

9. In a scanning apparatus which periodically sweeps a beam of light across a printed circuit board along a plurality of sweep paths, said scanning apparatus including detector means, responsive to radiation from the printed circuit board as it is swept by said beam of light and to an adjustment signal, for producing first and second signals indicative of whether a conductor portion or a substrate portion of said printed circuit board is being swept, the improvement comprising:

automatic level control means responsive to said first and second signals for providing level adjusted first and second output signals, the levels of which form a ratio, R, which is substantially the same for all printed circuit boards swept in said scanning apparatus, said automatic level control means including:

a first circuit means responsive to said first and second signals for producing said level adjusted first and second output signals;

adjustment means coupled to said detector means for providing said adjustment signal;

said first circuit means including first reference means responsive to at least one of said first signals for automatically producing a first reference signal with a signal level substantially equal to said first signals;

summing means responsive to said first and second signals and said first reference signal for summing said first and second signals with said first reference signal to produce said level adjusted first and second output signals and to produce intermediate summed first and second output signals during an adjustment interval;

said adjustment means further comprising a second comparator circuit responsive to said intermediate summed second output signals and to a fixed voltage input signal having a signal level substantially equal to a preselected level, said second comparator circuit for providing correction signals;

an adjustment circuit for generating and transmitting said adjustment signal to said detector means, the level of said adjustment signal being changed in response to said correction signals; and said adjustment interval comprising a plurality of laser beam sweeps, said first reference means providing a first reference signal during each laser beam sweep and said second comparator means generating a correction signal every N laser beam sweeps.

10. The improvement as claimed in claim 9 wherein said laser beam sweeps across conductor and substrate calibration portions of said printed circuit board during each laser beam sweep of said adjustment interval.

11. The improvement as claimed in claim 1 wherein said first signals are produced in response to reflection of said beam of light from conducting portions of said printed circuit board and said second signals are produced in response to fluorescence of said substrate portion of said printed circuit board when said beam of light is incident thereon.

12. The method of providing level adjusted first and second output signals in response to first and second signals generated in a scanning apparatus which periodically sweeps a beam of light across a printed circuit board along a plurality of sweep paths, said scanning apparatus including detector means, responsive to radiation from the printed circuit board as it is swept by said beam of light and to an adjustment signal, for producing first and second signals indicative of whether a conductor portion or a substrate portion of said printed circuit board is being swept, the method comprising the steps of:
  generating automatically a first reference signal having a signal level substantially equal to said first signal;
  summing said first reference signal with said first and second signals to produce level controlled first and second output signals, said first output signals having a signal level substantially equal to zero; and
  generating and transmitting automatically said adjustment signal to said detector means such that when said second signals are summed with said first reference signal, level controlled second output signals having a signal level substantially equal to a preselected signal level are produced.

13. The method as claimed in claim 12 wherein the step of generating automatically a first reference signal includes:
  generating a first reference signal having an initial signal level;
  forming a sample signal of said first signals during a first time interval when only said first signals are being transmitted, said sample signal having a signal level substantially equal to the signal level of said first signals;
  comparing the value of said first sample signal and said first reference signal to generate first correction signals therefrom; and
  changing the value of said first reference signal during said first time interval in response to said first correction signals whereby the level of said first reference signal is made substantially equal to the level of said first signals.

14. The method as claimed in claim 12 or 13 wherein the step of generating and transmitting automatically an adjustment signal comprises:
  summing said first and second signals with said first reference signal during an adjustment interval to produce intermediate summed first and second output signals;
  comparing said intermediate summed second signals with a fixed voltage signal having a signal level substantially equal to said preselected level to form a correction signal in response thereto;
  changing the level of said adjustment signal in response to said correction signal whereby the levels of said first and second signals are increased or decreased.

15. The method of claim 14 wherein said adjustment interval comprises a plurality of laser beam sweeps and the step of generating automatically a first reference signal is performed during each laser beam sweep of said adjustment interval.

16. The method of claim 15 wherein the step of comparing said intermediate summed second signals with said fixed voltage signal to form a correction signal is performed every N beam sweeps during said adjustment interval.

17. The method as claimed in claim 16 further comprising the step of:
  forming first and second calibration portions on said printed circuit boards such that said beam of light sweeps across said first calibration portion during the step of generating automatically said first reference signal and sweeps across said second calibration portion during the step of comparing said intermediate summed second signals with said fixed voltage signal.

* * * * *